United States Patent [19]

Bullock et al.

[11] Patent Number: 5,101,190
[45] Date of Patent: Mar. 31, 1992

[54] NON-METAL HIGH RESISTANCE ELECTRIC CABLE

[75] Inventors: Roddy M. Bullock, San Marcos; Vu A. Lai, Austin, both of Tex.

[73] Assignee: W. L. Gore & Associates, Inc., Newark, Del.

[21] Appl. No.: 502,200

[22] Filed: Mar. 28, 1990

[51] Int. Cl.$^5$ .............................. H01C 3/06
[52] U.S. Cl. ..................... 338/214; 338/66
[58] Field of Search .................. 338/214, 66; 174/102 SC, 120 R, 120 SC

[56] References Cited

U.S. PATENT DOCUMENTS

| 1,722,153 | 7/1929 | Meurer et al. | 174/120 SC |
| 4,237,731 | 12/1980 | Dehn | 73/352 |
| 4,436,565 | 3/1984 | Weitzel et al. | 174/102 SC X |

Primary Examiner—Marvin M. Lateef
Attorney, Agent, or Firm—Gary A. Samuels

[57] ABSTRACT

A non-metal controlled high resistance electric cable formed by wrapping a center strength member of insulating microporous polytetrafluoroethylene with a narrow strip of conductive carbon-filled microporous polytetrafluoroethylene and jacketing the wrapped strand with an insulating microporous polytetrafluoroethylene or polyester jacket. The microporous polytetrafluoroethylene layers are preferably sintered and the optional polyester layer is preferably fused.

8 Claims, 2 Drawing Sheets

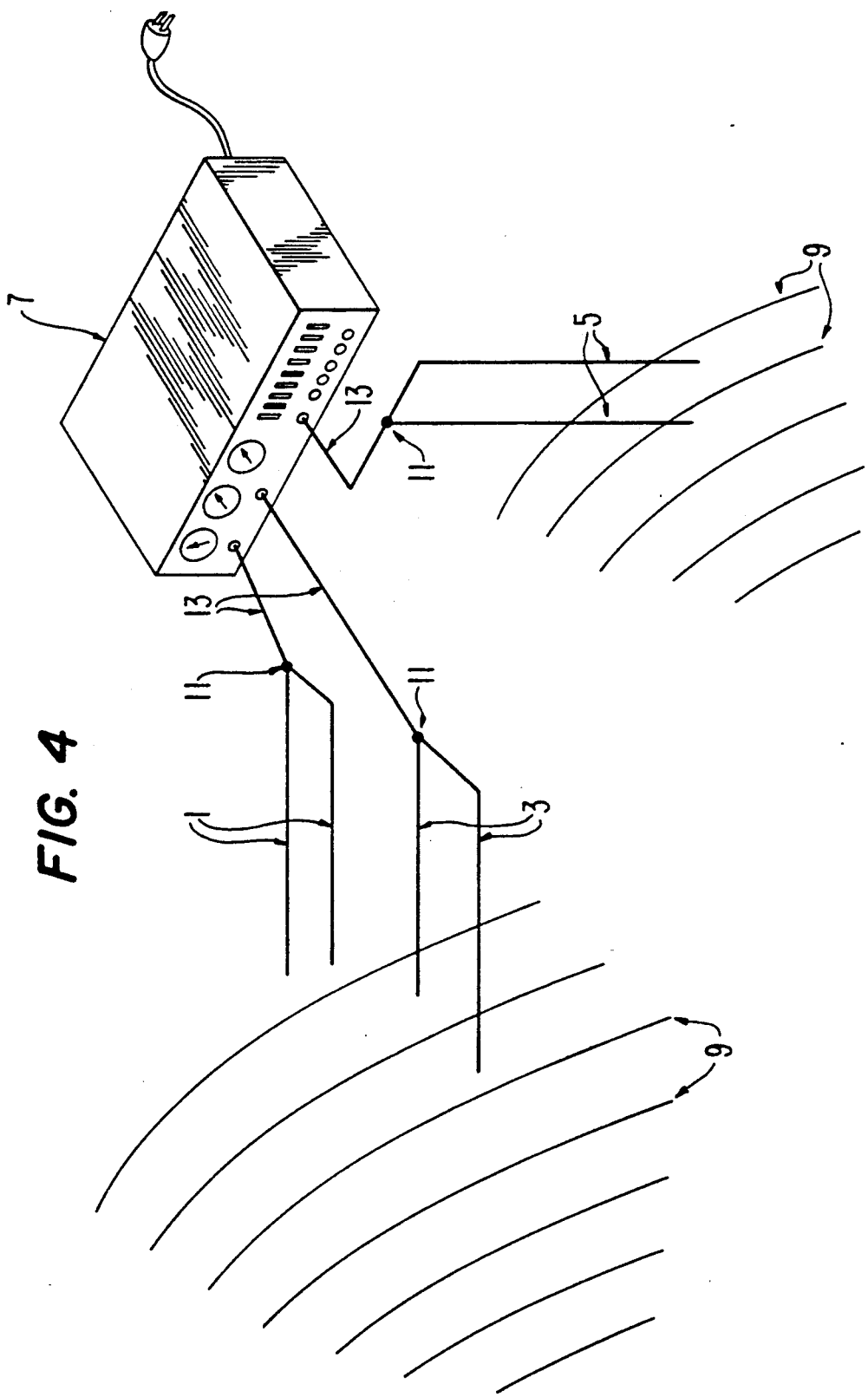

NON-METAL HIGH RESISTANCE ELECTRIC CABLE

FIELD OF THE INVENTION

This invention relates to non-metallic high resistance electric wires and cables.

BACKGROUND OF THE INVENTION

High resistance wires and cables conventionally have been manufactured from metal wires of very small diameter and hence greater electrical resistance or by combining a particulate conductive material, such as metal or conductive carbon powders, as a filler in polymeric material in which the amount of conductive material in the polymer strand controls the resistance of the filled polymer strand to passage of an electric current. Such strands or wires of controlled electrical resistance have been found to be useful to protect electric and electronic parts and equipment from surges of excessive power and to provide electric resistance heating by passage of current through the wire or strand. High resistance leads where negligible energy is desired to be transmitted have also been useful as leads for resistance type sensors, such as sensors for measuring the temperature in a microwave heating device, for example a food cooking oven. Another use is for leads to non-intrusive electromagnetic (EM) field strength in areas to be protected or where such fields are to be detected and/or monitored. A conventional EM probe usually consists of an antenna to sense the field components and a detector diode to rectify the EM signal so as to yield a direct current (DC) voltage proportional to the field intensity. The DC voltage is then conveyed to remote instrumentation for measurement or analysis by means of a high-resistance cable, which should ideally neither perturb or respond to the ambient EM field being measured. The present invention provides a high resistance cable designed to be used in an EM field probe which will not appreciably perterb or respond to the EM field being measured.

SUMMARY OF THE INVENTION

The invention comprises a non-metal high resistance electric cable for use with RF or EM field sensing probes. The cable consists of an electrically insulating polymer center strength member, which is preferably a porous polytetrafluoroethylene (PTFE) center strength member, which is helically wrapped with a relatively narrow conductive strip of electrically conductive carbon-filled porous PTFE. The conductive strip wrapped center strength member is preferably jacketed with an electrically non-conductive layer of insulating tape which is preferably porous PTFE. The porous PTFE center strength member, the carbon-filled conductive strip helically wrapped around it, and the preferred wrapped non-conductive porous PTFE jacket are sintered after completion of jacketing. Alternatively, a heat fusible adhesive-coated polyester tape wrapped jacket or an extruded polymer jacket may be placed on the cable after the porous PTFE materials have been sintered and cooled.

BRIEF DESCRIPTION OF THE DRAWINGS

FIG. 4 depicts a schematic view of a probe system which utilizes the cables of the invention.

DESCRIPTION OF THE INVENTION

Figure 1:
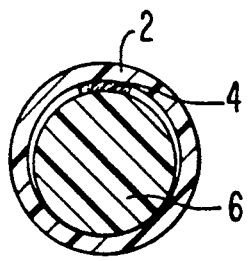
FIG. 1 is a cross-sectional view of the cable of the invention.

Describing the invention now with reference to the drawings, FIG. 1 shows a cross-sectional view of the cable of the invention with a center strength member 6 of porous PTFE, electrically conductive carbon-filled PTFE strip 4, and outer protective insulation jacket 2 of porous PTFE or adhesive-coated polyester shown. Strength member 6 is preferably selected from unsintered porous PTFE materials described in U.S. Pat. Nos. 3,953,566, 4,187,390, 3,962,153 and 4,096,227 which have an expanded porous structure characterized by nodes and fibrils, the disclosure of which is hereby incorporated by reference. The relatively narrow strip 4 of electrically conductive carbon-filled PTFE is helically wrapped about strength member 6 at a pitch selected to provide the resistance desired per unit length of cable. The total length of cable is not important, but the resistance per unit length is. The resistance per unit length of cable can be adjusted by raising or lowering the pitch of the helical wrap, and thus the length of conductive strip 4, by changing the diameter of strength member 6, changing the width and/or thickness of conductive strip 4, or by increasing or decreasing the amount of conductive carbon loaded into conductive strip 4, thus decreasing or increasing the electrical resistance of conductive strip 4. A typical strip 4 covers about 32% of the surface area of strength member 6 but could be helically wrapped in coils so closely together that about 90% of the surface of member 6 is covered. This would maximize the length of strip 4 for a unit length of cable, it being essential that there be no contact between coils of strip 4, however, such as could occur on bending the cable.

The electrically conductive strips 4 are made by slitting out a strip of selected width from a carbon-filled sheet of selected thickness and electrically-conductive carbon content. The carbon-filled sheets are prepared by a process described in patent application Ser. No. 07/324,166, filed on 3/16/89, to make conductive carbon-filled films now U.S. Pat. No. 4,985,296, issued Jan. 15, 1991. PTFE films containing about 25–85% by weight carbon are calendared or paste extruded from carbon containing coagulated aqueous PTFE dispersions and stretched or expanded to yield films or sheets containing from about 3% to about 25% by weight conductive carbon or less. Preferably, the PTFE sheets contain from about 3% to about 25% by weight carbon.

Figure 2:
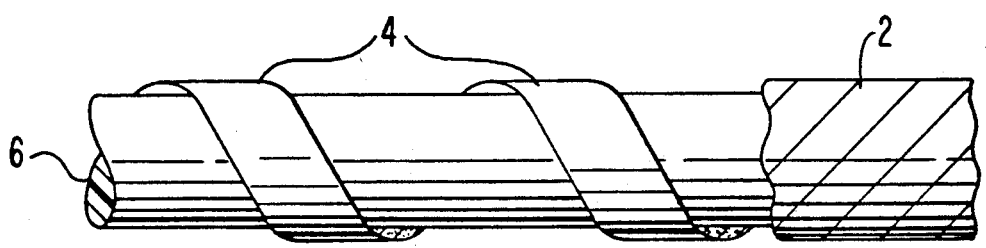
FIG. 2 shows a side view of the cable of the invention with the jacket cut away to expose the carbon-filled conductive strip and the center strength member.

FIG. 2 shows a side view of the cable with electrically conductive strip 4 helically wrapped about non-conducting center strength member 6, both being surrounded by outer jacket 2.

Figure 3:
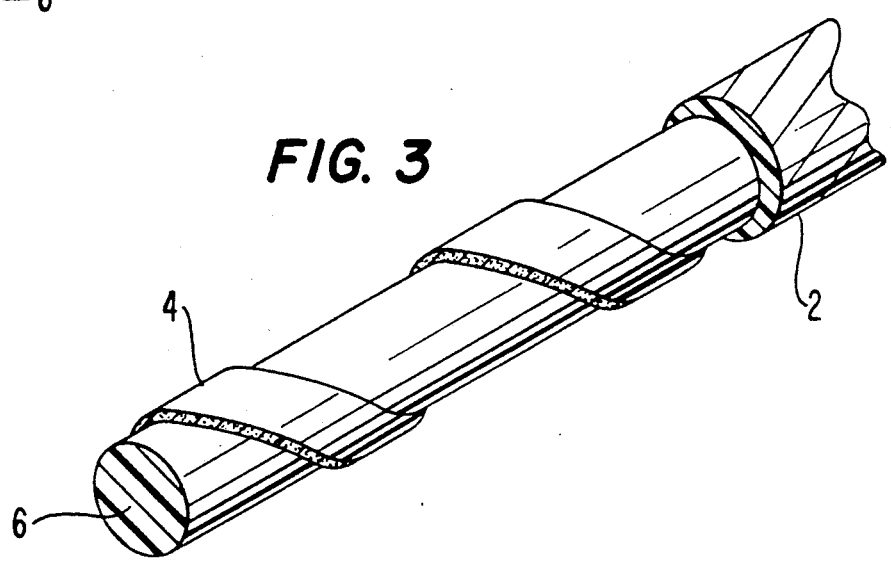
FIG. 3 is a perspective view of the cable of the invention with layers cut away for viewing the underlying layers.

FIG. 3 displays a perspective view of the cable, again with strip 4 helically wrapped around strength member 6, both being encased in jacket 2.

FIG. 4 depicts schematically a wide band isotropic probe system for monitoring the field strength of EM or RF radiation in either near or far zones. In a conventional isotropic EM or RF field probe, the sensing unit usually consists of three small dipoles 1, 3, and 5, placed in a mutually orthogonal arrangement. A sum of the three dipoles gives the total field strength of radiation impinging on the dipoles. Since each dipole is in a different axis, the total field strength is sensed, regardless of the direction of propagation or polarization of the waves. Common problems from such designs arise from the intrusion of the size of the dipole elements on the fields being sensed, resonation of elements, or low response times of sensing elements to field fluctuations. Use of miniature dipole elements which are short over their bandwidth can be used to eliminate intrusion on the fields being sensed and the resistive elements of the dipole tapered to prevent resonance.

In operation, the dipole elements 1, 3, and 5 are placed orthogonally and are used to detect the received electromagnetic radiation field. Each dipole element is connected to a diode 11 which rectifies the received field to produce a direct current voltage. The voltage is carried away from the elements to a metering unit 7 on high resistance lines 13 of which form a distributed filter along their length. These high resistance conductors 13 also provide further isolation from the field being sensed. The diode-based sensing also responds faster and is not susceptible to temperature fluctuations.

The non-metal high resistance conductors of the invention are highly suitable for use as elements 13 of a detector as described above and in FIG. 4.

The non-metal high resistance conductors are prepared by helically wrapping a center strength member 6 of selected size with an electrically conductive strip 4 at such a pitch to provide the length of strip 4 desired per unit length of center strength member 6 in order to control the resistance per unit length of resistance conductor. If a jacket 2 of polyester is placed on the outside of the cable, elements 4 and 6 are heated as a unit to about 370° C. for 0.5–1.5 minutes to sinter them. After cooling, the sintered cable is then wrapped with polyester tape slit from oriented and crosslinked polyester film. The polyester tape is coated with a heat-sealable adhesive before wrapping. It is this adhesive that seals the polyester layers together. Suitable adhesives for coating the polyester tape include polyurethane and polyester.

If outer jacket 2 is made of microporous PTFE tape, this tape is wound about the unsintered unit of center strength member 6, helically wrapped with conductive strip 4, and all three layers 2, 4, and 6 are sintered together for about 0.5–1.5 minutes at about the 370° C. sintering temperature for microporous PTFE to form a unitized cable. The size of center strength member 6, the size and pitch of helical winding, and the percentage of carbon-loading of strip 4 can all be varied to provide the resistance per unit length of cable desired for detecting and measuring an EM field of radiation.

If a center strength member 6 to be used in the cable comprises a polymer other than microporous PTFE, a suitable adhesive for bonding a strip of carbon-filled microporous PTFE to a different polymer is coated on strip 4. Suitable adhesives include heat-sealable forms of thermoplastic polymers, such as fluorinated ethylene-propylene copolymers (FEP), polymers of fluorinated alkoxy tetrafluoroethylene (PFA), polyvinyl fluoride, polyester or polyurethane.

In addition to a wrapped jacket 2 of microporous PTFE or an adhesive coated polyester tape, a jacket may be extruded onto the conductive strip-wrapped center strength member. An extruded jacket may comprise any thermoplastic material known for jacketing cables, such as FEP, polyvinyl fluoride, PFA, polyvinyl chloride, polyolefin, chlorinated rubber, fluorinated rubber, polyurethane rubber, nylon polyamide, or the like.

The cables of the invention can be made very small in diameter with very high resistance per unit length and can function where metal-containing cables cannot in that the metal therein interferes with signal or received radiation, picking up such radiation itself and interfering with the detection of and measurement of the radiation.

It is preferred that unsintered microporous PTFE be used throughout the cable of the invention in that all the parts of the cable can therefore be sintered together into a unitized whole.

We claim:

1. A non-metal high electrical resistance cable comprising in order:
   (a) an insulating polymer center strength member;
   (b) helically-wrapped about said center member a strip of electrically conductive carbon-filled polymer; and
   (c) surrounding said center strength member (a) and strip (b) a polymer jacket.

2. A cable of claim 1 wherein said center strength member and said polymer in said conductive carbon-filled strip comprise microporous polytetrafluoroethylene and said polymeric jacket comprises microporous polytetrafluoroethylene or polyester.

3. A cable of claim 2, wherein all said microporous polytetrafluoroethylene materials have been sintered and the polyester jacket fused.

4. A process for preparing a non-metal high electrical resistance cable comprising the steps of:
   (a) helically wrapping a center strength member of microporous polytetrafluoroethylene with a strip of electrically conductive carbon-filled microporous polytetrafluoroethylene;
   (b) helically wrapping said wrapped member with a tape comprising insulative microporous polytetrafluoroethylene to form a jacket around said wrapped member;
   (c) heating said jacketed wrapped member to about 370° C. for a time such as to fully sinter said microporous polytetrafluoroethylene therein;
   (d) cooling said sintered jacketed wrapped member.

5. A cable of claims 1, 2, or 3 wherein said electrically conductive carbon-filled strip covers less than 10% of the surface area of said center strand.

6. A cable of claims 1, 2, or 3 wherein said electrically conductive carbon-filled strip covers more than 50% of the surface area of said center strength member.

7. A cable of claims 1, 2, or 3 wherein said electrically conductive carbon-filled strip contains from about 3% to about 25% conductive carbon fill.

8. A cable of claims, 1, 2, or 3 wherein said electrically conductive carbon-filled strip covers about 10% to about 90% of the surface area of said center strength member.

* * * * *